(12) United States Patent
Loopstra et al.

(10) Patent No.: US 6,226,075 B1
(45) Date of Patent: May 1, 2001

(54) SUPPORTING DEVICE PROVIDED WITH A GAS SPRING WITH A GAS BEARING, AND LITHOGRAPHIC DEVICE PROVIDED WITH SUCH SUPPORTING DEVICES

(75) Inventors: Erik R. Loopstra, Heeze (NL); Peter Heiland, Wiesbaden (DE)

(73) Assignee: ASM Lithography, Veldhoven (NL)

( * ) Notice: Subject to any disclaimer, the term of this patent is extended or adjusted under 35 U.S.C. 154(b) by 0 days.

(21) Appl. No.: 09/110,612

(22) Filed: Jul. 6, 1998

(30) Foreign Application Priority Data

Jul. 22, 1997 (EP) .................................................. 97202280

(51) Int. Cl.[7] .......................... G03B 27/62; G03B 27/42; F16M 13/00
(52) U.S. Cl. ................................ 355/76; 355/53; 248/562
(58) Field of Search .................................. 355/53, 76, 63; 248/562, 622, 631; 60/370; 430/22

(56) References Cited

U.S. PATENT DOCUMENTS

| | | |
|---|---|---|
| 4,349,244 | 9/1982 | Hellriegel . |
| 4,907,021 | 3/1990 | Yabu . |
| 5,150,153 * | 9/1992 | Franken et al. .......................... 355/53 |
| 5,337,560 * | 8/1994 | Abdelmalek ............................ 60/370 |
| 5,376,988 | 12/1994 | Osanai ..................................... 355/53 |
| 5,858,587 * | 1/1999 | Yamane et al. .......................... 430/22 |

FOREIGN PATENT DOCUMENTS

| | | | |
|---|---|---|---|
| WO9638766 | 12/1996 | (EP) | ................................. G03F/9/00 |
| WO9638766 | 12/1996 | (WO) . | |

* cited by examiner

Primary Examiner—Russell Adams
Assistant Examiner—Peter B. Kim
(74) Attorney, Agent, or Firm—Pillsbury Winthrop LLP (57) ABSTRACT

A supporting device (53) provided with a first part (69), a second part (71), and a gas spring (73) for supporting the second part relative to the first part parallel to a support direction (Z). The gas spring (73) comprises a pressure chamber (75) which is provided in an intermediate part (79) and is bounded by a piston (81) which is displaceable in the intermediate part (79) parallel to the support direction and is supported perpendicularly to the support direction by means of a static gas bearing (85). A stiffness of the supporting device parallel to the support direction is thus substantially entirely determined by a stiffness of the gas spring, and a low stiffness can be achieved through a suitable design of the gas spring. A transmission of vibrations directed parallel to the support direction from the first part to the second part is prevented as much as possible thereby. The invention also relates to a lithography device having a plurality of such supporting devices.

21 Claims, 3 Drawing Sheets

SUPPORTING DEVICE PROVIDED WITH A GAS SPRING WITH A GAS BEARING, AND LITHOGRAPHIC DEVICE PROVIDED WITH SUCH SUPPORTING DEVICES

FIELD OF THE INVENTION

The invention relates to a supporting device provided with a first part, a second part, a gas spring with a pressure chamber for supporting the second part with respect to the first part parallel to a support direction, and means for preventing a transmission of vibrations from the first part to the second part.

The invention also relates to a lithographic device provided with a radiation source, a mask holder, a focusing unit having a main axis, a positioning device with a substrate holder which is displaceable relative to the focusing unit parallel to an X-direction which is perpendicular to the main axis and parallel to a Y-direction which is perpendicular to the X-direction and perpendicular to the main axis, a frame which supports at least the focusing unit parallel to a support direction, and a base which supports the frame by means of at least three supporting devices which each exert a supporting force on the frame which is directed parallel to the support direction.

BACKGROUND OF THE INVENTION

A supporting device and a lithographic device of the kinds mentioned in the opening paragraphs are known from WO-A-96/38766. The known lithographic device is used in the manufacture of integrated semiconductor circuits by means of an optical lithographic process. The radiation source in the known lithographic device is a light source, while the focusing unit is an optical lens system by means of which a partial pattern of an integrated semiconductor circuit, which is present on a mask which can be placed on the mask holder, is imaged on a reduced scale on a semiconductor substrate which can be placed on the substrate holder. Such a semiconductor substrate comprises a large number of fields on which identical semiconductor circuits are provided. The individual fields are for this purpose exposed consecutively through the mask, a next field of the semiconductor substrate being brought into position with respect to the focusing unit by means of the positioning device each time between two consecutive exposure steps. This process is repeated a number of times, with a different mask comprising a different partial pattern each time, so that integrated semiconductor circuits with comparatively complicated structures can be manufactured. Since these structures have detail dimensions which lie in the sub-micron range, the partial patterns present on the consecutive masks should be imaged on the fields of the semiconductor substrate with an accuracy which lies in the sub-micron range. The substrate holder and the mask holder should accordingly occupy accurate positions relative to the focusing unit during operation.

The frame of the known lithographic device is supported in a vertical direction by means of three supporting devices of the known kind, the first parts of the supporting devices being fastened to the base of the lithographic device, and the second parts of the supporting devices being fastened to the frame. The frame of the known lithographic device supports not only the focusing unit but also the mask holder and the substrate holder in the vertical direction, while the base is placeable on a floor. Since the substrate holder and the mask holder must occupy accurate positions relative to the focusing unit during operation, vibrations of the frame must be prevented as much as possible during operation. Such vibrations of the frame may be caused by vibrations in the base which are caused, for example, by floor vibrations. In the known lithographic device, vibrations in the base are in addition caused by reaction forces of the positioning device of the substrate holder and reaction forces of a further positioning device by means of which the mask holder is displaceable relative to the focusing unit. The three supporting devices accordingly serve not only for supporting the frame in the vertical direction, but also for preventing a transmission of vibrations from the base to the frame.

The pressure chamber of the gas spring of the known supporting device is bounded by a cylindrical vessel and by an annular membrane by means of which said vessel is suspended in the pressure chamber of the gas spring. The vessel is fastened to the second part by means of three comparatively thin tension rods which are positioned in the vessel and which extend parallel to the support direction. To prevent a transmission of vibrations from the base to the frame as much as possible, a mass spring system formed by the supporting devices and the frame together with the components of the lithographic device supported thereby must have natural frequencies which are as low as possible in directions parallel to the support direction and perpendicular to the support direction. The pressure chamber of the gas spring of the known supporting device has a comparatively large volume so as to provide the lowest possible natural frequency for the mass spring system mentioned above parallel to the support direction. The tension rods mentioned above have a comparatively great length so as to provide the lowest possible natural frequency of said mass spring system perpendicular to the support direction.

A disadvantage of the known supporting device is that the membrane used therein and bounding the pressure chamber of the gas spring has a comparatively great stiffness, whereby the natural frequency of said mass spring system parallel to the support direction is raised, and vibrations of the first part directed parallel to the support direction are partly transmitted to the second part. In addition, the membrane exerts a damping force on the second part during operation, whereby the transmission of vibrations having a comparatively high frequency from the first part to the second part is enhanced. Furthermore, an admissible length of the tension rods used in the known supporting device is limited by an admissible constructional height which the supporting device has parallel to the support direction. A minimum achievable value of the natural frequency of said mass spring system perpendicular to the support direction is also limited thereby, so that also vibrations of the first part directed perpendicular to the support direction are partly transmitted to the second part.

SUMMARY OF THE INVENTION

It is an object of the invention to provide a supporting device of the kind mentioned in the opening paragraph whose stiffness values are as low as possible in directions parallel to the support direction and perpendicular to the support direction, and to provide a lithographic device of the kind mentioned in the second paragraph in which a mass spring system formed by the supporting devices and by the frame with the components of the lithographic device supported thereby has natural frequencies which are as low as possible in directions parallel to the support direction and perpendicular to the support direction, such that a transmission of vibrations from the first part to the second part of the supporting device and from the base to the frame of the lithographic device is prevented as much as possible.

The supporting device according to the invention is for this purpose characterized in that the pressure chamber is bounded by a cylindrical inner wall of an intermediate part of the supporting device and by a piston which is displaceable in the intermediate part parallel to the support direction and which is supported with respect to the intermediate part in directions perpendicular to the support direction by means of a static gas bearing which is present between the inner wall of the intermediate part and an outer wall of the piston, said intermediate part being supported by the first part parallel to the support direction, while the piston is fastened to the second part.

The lithographic device according to the invention is for this purpose characterized in that each supporting device used therein is a supporting device according to the invention.

It is noted that the expression "cylindrical inner wall" is understood to mean an inner wall which has the same cross-sectional area in any imaginary plane perpendicular to the support direction. This accordingly covers not only circular cross-sectional areas but also, for example, cross-sectional areas of an equilateral, polygonal shape.

The static gas bearing mentioned above exerts substantially no forces on the piston parallel to the support direction. In addition, the piston is suitable for the use of a sealing gap device between the outer wall of the piston and the inner wall of the intermediate part for sealing off the pressure chamber of the gas spring. Such a sealing gap also exerts substantially no forces on the piston parallel to the support direction. The supporting device according to the invention thus has a stiffness which, as seen parallel to the support direction, is substantially exclusively determined by a stiffness of the gas spring, so that it is possible to achieve a stiffness of the supporting device which is as low as possible parallel to the support direction through a suitable design of the gas spring. As a result, the mass spring system in the lithographic device according to the invention, formed by the supporting devices according to the invention used therein and by the frame with the components of the lithographic device supported thereby, has the lowest possible natural frequency seen in directions parallel to the support direction, so that the transmission of vibrations directed parallel to the support direction from the base to the frame is prevented as much as possible.

A special embodiment of a supporting device according to the invention is characterized in that the static gas bearing is provided with a gas supply line which is in communication with the pressure chamber. The static gas bearing requires no further gas supply owing to the use of said gas supply line, so that a particularly simple construction of the piston and of the static gas bearing used therein is provided.

A further embodiment of a supporting device according to the invention is characterized in that the intermediate part is supported relative to the first part parallel to the support direction by a further static gas bearing by means of which the intermediate part is guided over a support surface of the first part with displacement possibility perpendicular to the support direction. The further static gas bearing has a very high stiffness as seen parallel to the support direction, so that the presence of the further static gas bearing has substantially no influence on the stiffness which the supporting device has parallel to the support direction and which is substantially exclusively determined by the stiffness of the gas spring. The further static gas bearing exerts substantially no forces on the intermediate part perpendicular to the support direction, so that the intermediate part is displaceable substantially frictionlessly relative to the first part perpendicular to the support direction. As a result, this further embodiment of the supporting device has a stiffness which is substantially zero in directions perpendicular to the support direction. The natural frequency of the mass spring system formed by the supporting devices in accordance with this further embodiment used therein and by the frame with the components of the lithographic device supported thereby is thus substantially zero perpendicular to the support direction in the lithographic device according to the invention, so that the transmission of vibrations directed perpendicular to the support direction from the base to the frame is substantially fully prevented.

A yet further embodiment of a supporting device according to the invention is characterized in that the further static gas bearing is present between the support surface of the first part and a bottom wall of the intermediate part which bounds the pressure chamber. The further static gas bearing is thus pretensioned parallel to the support direction by means of a gas pressure prevailing in the pressure chamber during operation, so that the further static gas bearing requires no further pretensioning means and a simple construction of the further static gas bearing is provided.

A special embodiment of a supporting device according to the invention is characterized in that the further static gas bearing is provided with a gas supply line which is in communication with the pressure chamber. The further static gas bearing requires no further gas supply owing to the use of said gas supply line, so that a particularly simple construction of the further static gas bearing is provided.

A further embodiment of a supporting device according to the invention is characterized in that the intermediate part comprises a passage by means of which the pressure chamber is in communication with a main chamber of the gas spring provided in the first part. The use of said main chamber substantially increases the volume of the gas spring, so that the stiffness of the gas spring parallel to the support direction is reduced. The use of the main chamber further achieves that a volume of the pressure chamber arranged in the intermediate part can be reduced, so that the displaceable intermediate part need have limited dimensions only.

A yet further embodiment of a supporting device according to the invention is characterized in that the passage is provided in the bottom wall of the intermediate part and merges into a further passage which is provided in the support surface of the first part and is in communication with the main chamber. The use of said passage in the bottom wall and said further passage in the support surface provides a simple and practical connection between the pressure chamber and the main chamber which causes substantially no interfering forces on the intermediate part, as seen perpendicular to the support direction.

A special embodiment of a supporting device according to the invention, in which the further static gas bearing is present between the support surface of the first part and a bottom wall of the intermediate part bounding the pressure chamber, and in which the further static gas bearing is provided with a gas supply line which is in communication with the pressure chamber, is characterized in that the gas supply line of the further static gas bearing comprises the passage in the bottom wall of the intermediate part. The passage in the bottom wall thus has a dual function, whereby a particularly simple and practical construction of the further static gas bearing and the gas supply line used therein is achieved.

A further embodiment of a supporting device according to the invention is characterized in that the piston is fastened to the second part by means of a connection member which is substantially undeformable parallel to the support direction and which is capable of bending about two mutually perpendicular bending axes which are perpendicular to the support direction. The use of said connection member prevents a transmission of rotational vibrations of the first part about an axis of rotation which is perpendicular to the support direction to the second part as much as possible. Since such rotational vibrations of the first part are comparatively small during operation, said rotational vibrations of the second part are already sufficiently prevented if said connection member has a limited bending stiffness about said bending axes. Since the connection member is substantially undeformable parallel to the support direction, the presence of the connection member has substantially no influence on the stiffness which the supporting device has parallel to the support direction.

A yet further embodiment of a supporting device according to the invention is characterized in that the connection member comprises a rubber ring. The use of the rubber ring provides a particularly simple construction of the connection member accompanied by a bending stiffness of the connection member which is sufficiently limited for most applications.

BRIEF DESCRIPTION OF THE DRAWINGS

The invention will be explained in more detail below with reference to the drawing, in which.

DETAILED DESCRIPTION OF THE DRAWINGS

Figure 1:
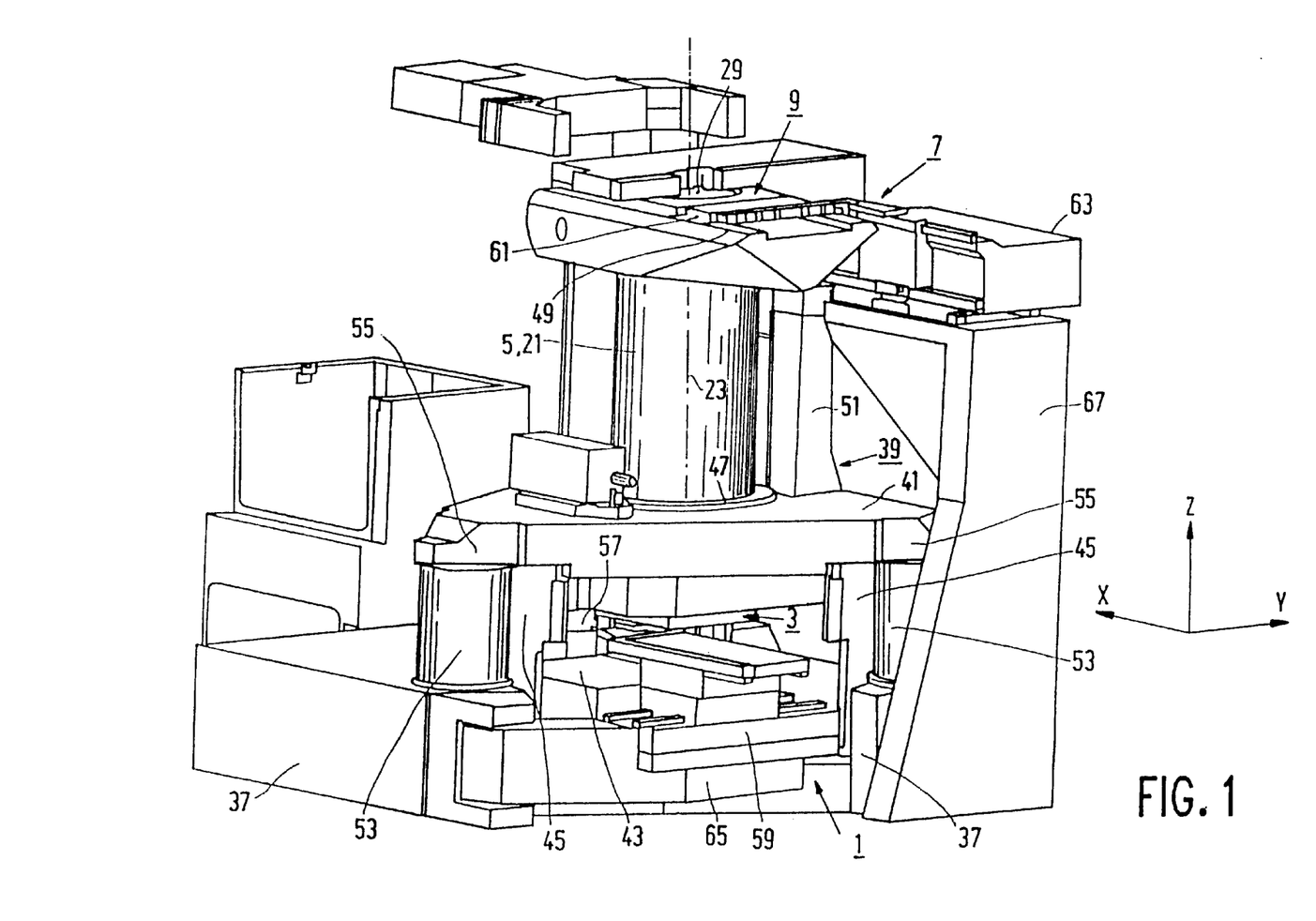
FIG. 1 shows a lithographic device according to the invention, FIG. 2 diagrammatically shows the lithographic device of FIG. 1.
Figure 2:
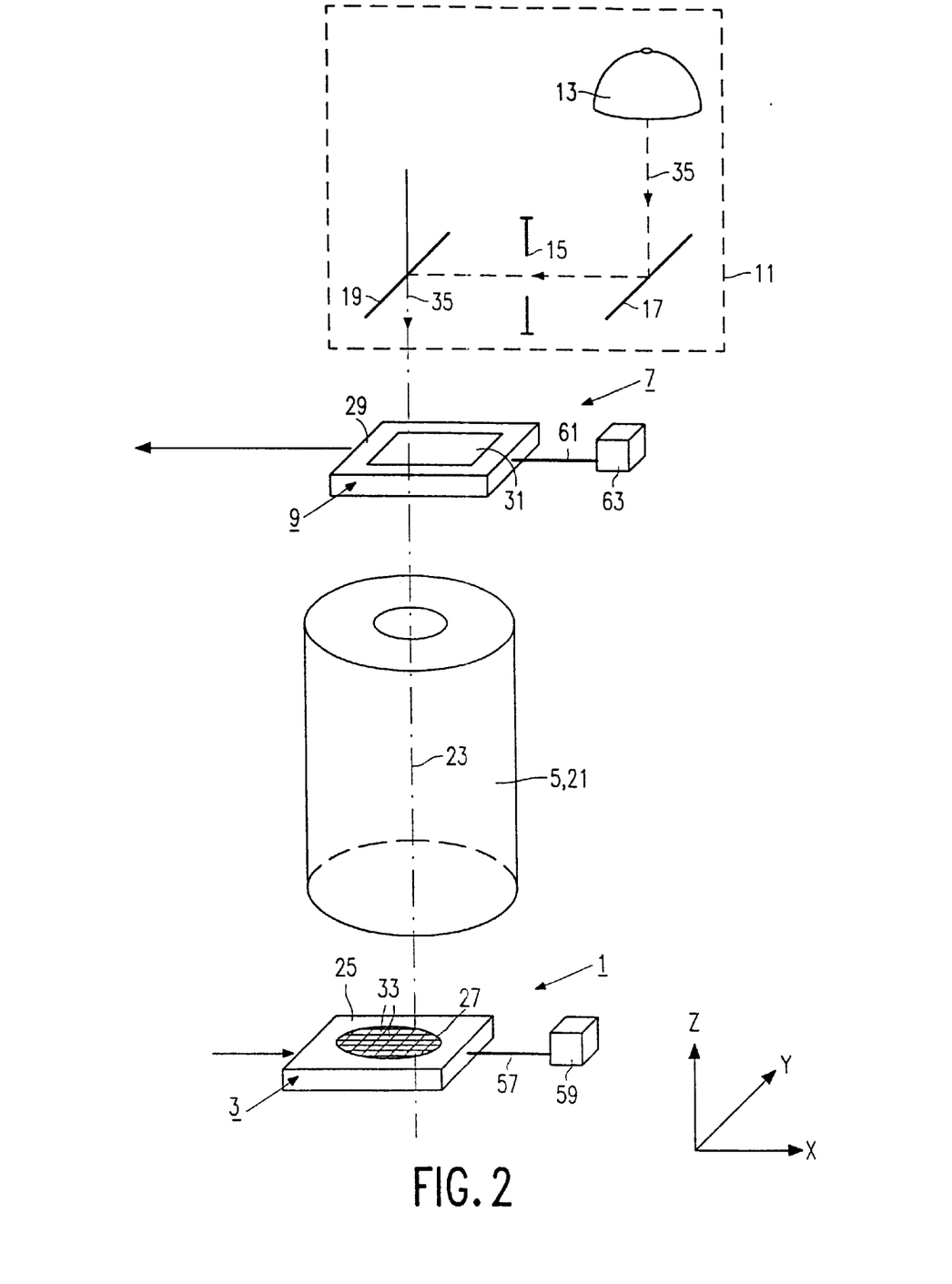

The lithographic device according to the invention shown in FIGS. 1 and 2 is suitable for use in the manufacture of integrated semiconductor circuits by a lithographic process. As FIGS. 1 and 2 show, the lithographic device is provided parallel to a vertical Z-direction with, in that order, a positioning device 1 with a substrate holder 3, a focusing unit 5, a further positioning device 7 with a mask holder 9, and a radiation source 11. The lithographic device is an optical lithographic device in which the radiation source 11 comprises a light source 13, a diaphragm 15, and mirrors 17 and 19, while the focusing unit 5 is an imaging or projection system provided with an optical lens system 21 with an optical main axis 23 directed parallel to the Z-direction and an optical reduction factor which is, for example, 4 or 5. The substrate holder 3 comprises a support surface 25 which extends perpendicular to the Z-direction and on which a semiconductor substrate 27 can be placed, and is displaceable relative to the focusing unit 5 parallel to an X-direction which is perpendicular to the Z-direction, and parallel to a Y-direction which is perpendicular to the X-direction and perpendicular to the Z-direction by means of the positioning device 1. The mask holder 9 comprises a support surface 29 which extends perpendicular to the Z-direction and on which a mask 31 can be placed, and is displaceable relative to the focusing unit 5 parallel to the X-direction by means of the further positioning device 7.

The semiconductor substrate 27 comprises a large number of fields 33 on which identical semiconductor circuits are provided, while the mask 31 comprises a pattern or a sub-pattern of a single integrated semiconductor circuit. During operation, the individual fields 33 of the semiconductor substrate 27 are consecutively exposed through the mask 31. A light beam 35 originating from the light source 13 is guided through the mask 31 via the diaphragm 15 and the mirrors 17, 19 during an exposure step and is focused on an individual field 33 of the semiconductor substrate 27 by the focusing unit 5, so that the pattern present on the mask 31 is imaged on a reduced scale on said field 33 of the semiconductor substrate 27. An imaging method following the so-called "step and scan" principle is used in the lithographic device shown, wherein the semiconductor substrate 27 and the mask 31 are synchronously displaced relative to the focusing unit 5 parallel to the X-direction by means of the positioning device 1 and the further positioning device 7, respectively, during an exposure step, and after an exposure of an individual field 33 a next field 33 of the semiconductor substrate 27 is brought into position relative to the focusing unit 5 each time in that the substrate holder 3 is displaced stepwise parallel to the X-direction and/or parallel to the Y-direction by means of the positioning device 1. The pattern present on the mask 31 is thus scanned parallel to the X-direction and imaged on the consecutive fields 33 of the semiconductor substrate 27. This process is repeated a number of times, each time with a different mask comprising a different pattern or sub-pattern, so that integrated semiconductor circuits with complicated layered structures can be manufactured. Such structures have detail dimensions which lie in the sub-micron range. The patterns or sub-patterns present on the masks should accordingly be imaged on the semiconductor substrates with an accuracy which also lies in the sub-micron range, which means that very stringent requirements are imposed on the accuracy with which the substrate holder 3 and the mask holder 9 can be positioned relative to the focusing unit 5 by means of the positioning device 1 and the further positioning device 7, respectively.

As FIG. 1 further shows, the lithographic device comprises a base 37 which can be placed on a horizontal floor. The lithographic device further comprises a frame 39 which supports the substrate holder 3, the focusing unit 5, and the mask holder 9 parallel to a vertical support direction which extends parallel to the Z-direction. The frame 39 is provided with a triangular, comparatively stiff metal main plate 41 which extends transversely to the optical main axis 23 of the focusing unit 5 and which is provided with a central light transmission opening which is not visible in FIG. 1. The substrate holder 3 is displaceably guided over a carrier 43 of the frame 39 which extends perpendicular to the Z-direction and which is suspended from a lower side of the main plate 41 by means of three vertical suspension plates 45. It is noted that only two of the three suspension plates 45 are partly visible in FIG. 1. The focusing unit 5 is fastened to the main plate 41 by means of a mounting ring 47 which is fastened to the focusing unit 5 adjacent a lower side. The mask holder 9 is displaceably guided over a further carrier 49 of the frame 39 which extends parallel to the X-direction. The further carrier 49 is fastened to a vertical, comparatively stiff metal column 51 of the frame 39 which is fastened on the main plate 41. The base 37 supports the frame 39 parallel to the vertical support direction by means of three supporting devices 53 according to the invention which are mutually arranged in a triangle and which each exert a supporting force on the main plate 41 of the frame 39 directed parallel to the support direction. The main plate 41 for this purpose has three corner portions 55 by means of which the main plate 41 rests on the three supporting devices 53. It is noted that only two of the three corner portions 55 of the main plate 41 and two of the three supporting devices 53 are visible in FIG. 1.

As FIG. 1 shows, and FIG. 2 shows diagrammatically, the positioning device 1 comprises a first part 57 and a second part 59, while the further positioning device 7 comprises a first part 61 and a second part 63. The first parts 57 and 61 are fastened to the substrate holder 3 and to the mask holder 9, respectively, while the second parts 59 and 63 are fastened to the base 37. The second parts 59 and 63 exert driving forces on the respective first parts 57 and 61 during operation, whereupon the first parts 57 and 61 exert reaction forces on the respective second parts 59 and 63. As is visible in FIG. 1, the second part 59 of the positioning device 1 is fastened to a comparatively stiff metal arm 65 which is fastened to the base 37, and the second part 63 of the positioning device 7 is fastened to a further comparatively stiff metal column 67 which is also fastened to the base 37. The reaction forces of the positioning device 1 and the further positioning device 7 are thus transmitted to the base 37. Vibrations are caused in the base 37 under the influence of said reaction forces. Since the base 37 is placed on a floor, vibrations will also arise in the base 37 under the influence of vibrations present in the floor. A transmission of the vibrations present in the base 37 through the supporting devices 53 into the frame 39 must be prevented as much as possible during operation because the frame 39 supports the substrate holder 3, the mask holder 9, and the focusing unit 5 parallel to the vertical support direction, and because very stringent requirements are imposed on the accuracy with which the substrate holder 3 and the mask holder 9 can be positioned relative to the focusing unit 5 by the positioning device 1 and the further positioning device 7, respectively. The supporting devices 53 are for this purpose provided with means, to be described in more detail further below, for preventing a transmission of vibrations from the base 37 into the frame 39.

Figure 3:
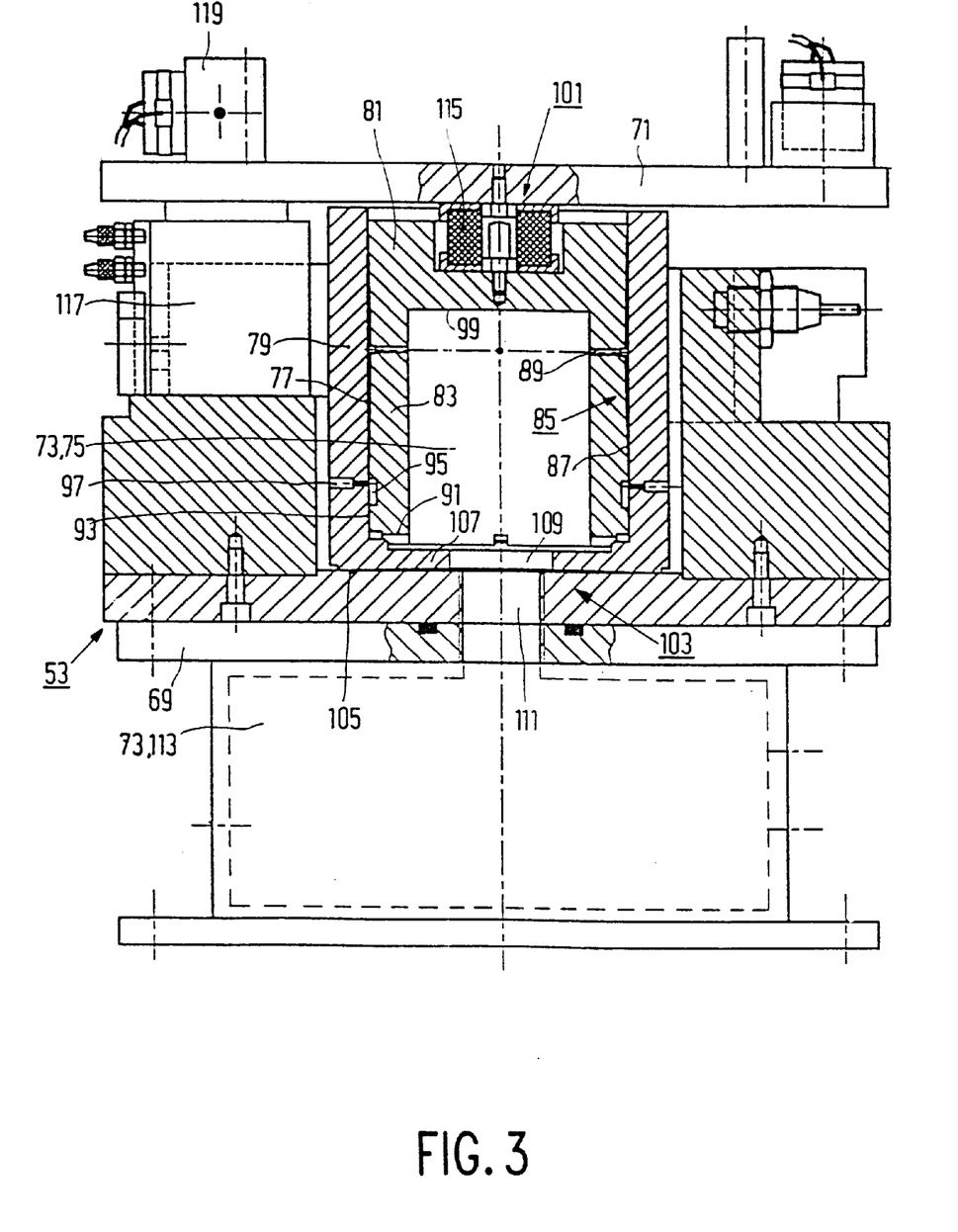
FIG. 3 is a diagrammatic cross-sectional view of a supporting device according to the invention suitable for use in the lithographic device of FIG. 1.

As FIG. 3 shows, the supporting device 53 according to the invention used in the lithographic device according to the invention comprises a first part 69 which can be fastened to the base 37 of the lithographic device, a second part 71 which can be fastened to the frame 39 of the lithographic device, and a gas spring 73 for supporting the second part 71 relative to the first part 69 by means of a supporting force which is directed parallel to the vertical support direction. The gas spring 73 comprises a pressure chamber 75 in which a comparatively high gas pressure is present during operation. The pressure chamber 75 is bounded by a cylindrical inner wall 77 of a beaker-shaped intermediate part 79 of the supporting device 53 and by a piston 81 which is displaceable in the intermediate part 79 parallel to the support direction. The piston 81 comprises a sleeve 83 which is supported relative to the intermediate part 79 perpendicular to the support direction by means of a static gas bearing 85 which is present between the cylindrical inner wall 77 of the intermediate part 79 and a cylindrical outer wall 87 of the sleeve 83. The static gas bearing 85 is a conical gap bearing which is usual and known per se and is provided with a gas supply line 89 which is provided in the sleeve 83 and is in communication with the pressure chamber 75. The use of the gas supply line 89 provided in the sleeve 83 achieves a particularly simple and practical gas supply to the static gas bearing 85, so that the static gas bearing 85 and the piston 81 have a simple and practical construction. Adjacent a lower side 91 of the sleeve 83, a sealing gap device 93 is present between the inner wall 77 of the intermediate part 79 and the outer wall 87 of the sleeve 83, so that a leakage of gas from the pressure chamber 75 along the piston 81 is prevented as much as possible. A trapping groove 95 for gas leaking along the sealing gap 93 and gas flowing from the static gas bearing 85 is provided between the sealing gap 93 and the static gas bearing 85 in the outer wall 87 of the sleeve 83. The trapping groove 95 is in communication with a number of exhaust channels 97 provided in the intermediate part 79 for the removal of the gas present in the trapping groove 95 to the surroundings. The use of the trapping groove 95 and the exhaust channels 97 prevents the operation of the static gas bearing 85 from being influenced by gas which leaks along the sealing gap 93. The supporting force supplied by the supporting device 53 parallel to the vertical support direction thus is a gas force exerted by the gas in the pressure chamber 75 on the annular lower side 91 of the sleeve 83 and on an inner wall 99 of the piston 81 extending transversely to the support direction.

As FIG. 3 shows, the piston 81 is fastened to the second part 71 via a connection member 101 to be described in more detail below, while the beaker-shaped intermediate part 79 is supported relative to the first part 69 parallel to the vertical support direction by means of a further static gas bearing 103. The further static gas bearing 103 is also a conical gap bearing which is usual and known per se and is present between a support surface 105 of the first part 69 extending perpendicularly to the vertical support direction and a bottom wall 107 of the intermediate part 79, which bottom wall bounds the pressure chamber 75 and also extends perpendicularly to the vertical support direction. The beaker-shaped intermediate part 79 is guided substantially frictionlessly over the support surface 105 of the first part 69 by means of the further static gas bearing 103 and is thus substantially frictionlessly displaceable relative to the first part 69 in directions perpendicular to the vertical support direction. A passage 109 of the gas spring 73 is provided centrally in the bottom wall 107 of the intermediate part 79. The passage 109 is present opposite a further passage 111 of the gas spring 73 provided in the support surface 105 of the first part 69 and in communication with a main chamber 113 of the gas spring 73 arranged in the first part 69. The pressure chamber 75 of the gas spring 73 provided in the intermediate part 79 is thus in communication with the main chamber 113 of the gas spring 73 provided in the first part 69 via the passage 109 and the further passage 111. As FIG. 3 shows, the conical bearing gap of the further static gas bearing 103 merges directly into the passage 109 provided in the bottom wall 107 of the intermediate part 79, so that the passage 109 at the same time forms a gas supply line in communication with the pressure chamber 75 for the further static gas bearing 103. Since the passage 109 in the bottom wall 107 of the intermediate part 79 thus has a dual function, a particularly simple and practical construction of the further static gas bearing 103 and the gas supply used therein is obtained. The fact that the further static gas bearing 103 is present between the support surface 105 of the first part 69 and the bottom wall 107 of the intermediate part 79 provides a simple and practical pretensioning of the further static gas bearing 103 parallel to the vertical support direction during operation by means of the gas pressure prevailing in the pressure chamber 75, a supporting force directed parallel to the support direction and exerted on the intermediate part 79 by the gas in the conical bearing gap of the further static gas bearing 103 being to a large extent compensated for by a force exerted on the bottom wall 107 by the gas in the pressure chamber 75 in a direction opposed to that of said supporting force. In spite of the fact that the gas in the conical bearing gap of the further static gas bearing 103 on average has a lower pressure than the gas in the pressure chamber 75, such a compensation is possible because a surface area of the bottom wall 107 adjoining the bearing gap is larger than a surface area of the bottom wall 107 adjoining the pressure chamber 75.

The gas springs 73 of the supporting devices according to the invention used in the lithographic device according to the invention together with the frame 39 and the components of the lithographic device supported by the frame 39 constitute a mass spring system in which the frame 39 is displaceable relative to the base 37 parallel to the vertical support direction and perpendicularly to the vertical support direction, and is rotatable relative to the base 37 about an axis of rotation which is parallel to the vertical support direction and is pivotable about two mutually perpendicular pivot axes which are perpendicular to the vertical support direction. Displacements of the frame 39 relative to the base 37 parallel to the support direction are possible in that the pistons 81 of the supporting devices 53 are displaceable in the intermediate parts 79 parallel to the support direction, while displacements of the frame 39 relative to the base 37 perpendicular to the support direction are possible in that the intermediate parts 79 of the supporting devices 53 are displaceable relative to the first parts 69 perpendicularly to the support direction. Rotations of the frame 39 about an axis of rotation directed parallel to the support direction are possible in that the intermediate parts 79 of the supporting devices 53 are rotatable relative to the first parts 69 about an axis of rotation parallel to the support direction through the use of the further static gas bearings 103. Pivoting movements of the frame 39 about the pivot axes which are perpendicular to the support direction are possible in that the pistons 81 of the supporting devices 53 are fastened to the second parts 71 via the connection members 101 mentioned above. As FIG. 3 shows, the connection members 101 each comprise a simple rubber ring 115 which is substantially undeformable parallel to the support direction and which is capable of bending about two mutually perpendicular bending axes which are perpendicular to the support direction. To prevent a transmission of vibrations from the base 37 to the frame 39 of the lithographic device and from the first parts 69 to the second parts 71 of the supporting devices 53 as much as possible, said mass spring system has natural frequencies which are as low as possible seen parallel to the support direction, seen perpendicular to the support direction, seen around the axis of rotation which is parallel to the support direction, and seen about said pivot axes which are perpendicular to the support direction, i.e. the supporting devices 53 have a stiffness which is as low as possible in directions parallel to the support direction, perpendicular to the support direction, around the axis of rotation parallel to the support direction, and around the pivot axes perpendicular to the support direction.

A lowest possible stiffness of the supporting device 53 parallel to the support direction is achieved in that the gas spring 73 is given a volume which is as large as possible. The gas spring 73 is for this purpose provided with the main chamber 113 described above in addition to the pressure chamber 75, which main chamber is in communication with the pressure chamber 75. The use of the main chamber 113 renders it possible to reduce the volume of the pressure chamber 75, so that the dimensions and weight of the displaceable intermediate part 79 can remain limited. Furthermore, a gas supply channel (not shown in the Figures) of the gas spring 73, by means of which an average gas pressure is kept constant in the gas spring 73, can be connected to the main chamber 113. Since the pressure chamber 75 according to the invention is bounded by the piston 81 which is displaceably guided in the intermediate part 79 by means of the static gas bearing 85, the stiffness of the supporting device 53 parallel to the support direction is substantially exclusively determined by the stiffness of the gas spring 73. The static gas bearing 85 and the sealing gap 93 in fact exert substantially no frictional forces on the piston 81 as seen parallel to the support direction. Neither is the stiffness of the supporting device 53 parallel to the support direction substantially influenced by the presence of the connection member 101, which is substantially undeformable parallel to the support direction, or by the presence of the further static gas bearing 103, which also has a very high stiffness seen parallel to the support direction. Since the stiffness of the supporting device 53 parallel to the support direction is substantially entirely determined by the stiffness of the gas spring 73, a suitable design of the pressure chamber 75 and the main chamber 113 will achieve a sufficiently low stiffness of the gas spring 73, so that the transmission of vibrations directed parallel to the support direction from the first part 69 to the second part 71 of the supporting device 53 is prevented as much as possible.

The fact that the intermediate part 79 of the supporting device 53 is substantially frictionlessly displaceable over the support surface 105 of the first part 69 by means of the further static gas bearing 103 implies that the supporting device 53 has a stiffness which is substantially zero in directions perpendicular to the support direction, while the mass spring system of the lithographic device mentioned above has a natural frequency which is also substantially zero perpendicular to the support direction. A transmission of vibrations directed perpendicularly to the support direction from the base 37 and the first part 69 to the frame 39 and the second part 71 is substantially fully prevented thereby.

The supporting device 53 has a stiffness which again is substantially zero around an axis of rotation extending parallel to the support direction because the intermediate part 79 of the supporting device 53 is substantially frictionlessly rotatable over the support surface 105 of the first part 69 owing to the use of the further static gas bearing 103, so that the transmission of rotational vibrations of the first part 69 about an axis of rotation extending parallel to the support direction to the second part 71 of the supporting device 53 is also substantially fully prevented.

The rubber ring 115 used in the connection member 101 has a limited bending stiffness about said bending axes which are perpendicular to the support direction. Since rotational vibrations of the first part 69 about a pivot axis perpendicular to the support direction are substantially absent or are comparatively small during operation, the transmission of such rotational vibrations from the first part 69 to the second part 71 of the supporting device 53 is already sufficiently prevented through the use of said rubber ring 115 having the limited bending stiffness. It is noted, however, that instead of the connection member 101 with the rubber ring 115 an alternative connection member may be used if a smaller bending stiffness of the connection member is desired, or a limited bending stiffness of the connection member is even undesirable. Thus, for example, a ball joint may be used, for example provided with a static gas bearing, instead of the rubber ring 115.

As was discussed above, the second part 71 of the supporting device 53 is displaceable relative to the first part 69 in directions parallel to the support direction and perpendicular to the support direction, is rotatable about an axis of rotation extending parallel to the support direction, and is pivotable about two mutually perpendicular pivot axes which are perpendicular to the support direction. It is noted that the supporting device 53 or the lithographic device according to the invention may be provided with means for preventing or restricting such displacements, rotations, and pivoting movements. Thus, for example, a system of motion dampers may be provided between the first part 69 and the second part 71. An advantageous construction is obtained when a system of Lorentz force actuators, usual and known per se, is used between the first part 69 and the second part 71. Since such Lorentz force actuators are contactless, such Lorentz force actuators do not transmit any vibrations from the first part 69 to the second part 71. The three supporting devices 53 in the lithographic device according to the invention may each be provided, for example, with one pair of Lorentz force actuators, in which case the three pairs of Lorentz force actuators of the three supporting devices 53 in combination serve to prevent or restrict said displacements, rotations, and pivoting movements of the frame 39 relative to the base 37. Reference numeral 117 in FIG. 3 diagrammatically indicates such a pair of Lorentz force actuators, and reference numeral 119 denotes an acceleration sensor which is to cooperate with the Lorentz force actuators for measuring accelerations of the second part 71.

An imaging method following the so-called "step and scan" principle is used in the lithographic device according to the invention described above. It is noted that the invention also relates to lithographic devices in which an imaging method following the "step and repeat" principle is used, where the mask and the semiconductor substrate are held in constant positions relative to the focusing unit during the exposure of the semiconductor substrate.

The frame 39 supports not only the focusing unit 5 but also the substrate holder 3 and the mask holder 9 in the lithographic device according to the invention described above. It is noted that the invention also relates to lithographic devices in which the substrate holder and the mask holder are supported by other supporting parts of the lithographic device. Since at least the focusing unit must occupy an accurately defined position in such lithographic devices, the invention relates to lithographic devices in which the frame supported by the supporting devices according to the invention supports at least the focusing unit.

It is further noted that a supporting device according to the invention may be used not only in a lithographic device but also, for example, in finishing machines, machine tools, and other machines or devices in which the transmission of vibrations to certain components thereof supported by the supporting device is to be prevented as much as possible.

It is finally noted that the invention also covers supporting devices in which the intermediate part is fastened in a fixed position relative to the first part. In such a supporting device, a transmission of vibrations directed perpendicularly to the support direction from the first part to the second part is not prevented, but such a transmission may be admissible if, for example, the vibrations directed perpendicularly to the support direction are negligibly small in certain applications of the supporting device.

What is claimed is:

1. A supporting device for supporting a supported structure relative to a supporting structure, said device comprising:

a first part provided on the supporting structure, a second part provided on the supported structure, an intermediate part provided on one of said first and second parts, said intermediate part providing an inner cylindrical wall bounding a pressure chamber;

a piston provided on the other of said first and second parts, said piston being displaceable in said pressure chamber such that said piston and said chamber cooperate to define a gas spring constructed and arranged to support said first part relative to said second part parallel to a support direction;

wherein said piston is supported with respect to the cylindrical inner wall in directions perpendicular to the support direction by a static gas bearing which is present between the inner wall and an outer wall of the piston, said static gas bearing (a) sealing said gas spring between said inner and outer walls and (b) maintaining said inner wall and said outer wall in spaced apart relation to prevent a transmission of vibrations between said inner and outer walls in said support direction, and wherein said intermediate part is supported with respect to the aforesaid one of said first part and said second part in directions parallel to the support direction by a further static gas bearing positioned between opposing surfaces of said intermediate part and the aforesaid one of said first part and said second part, said further static gas bearing maintaining said opposing surfaces in spaced apart relation to prevent a transmission of vibrations therebetween perpendicular to said support direction.

2. A supporting device as claimed in claim 1, wherein the static gas bearing is provided with a gas supply line which is in communication with the pressure chamber.

3. A supporting device as claimed in claim 1, wherein the further static gas bearing is present between the support surface of the first part and a bottom wall of the intermediate part which bounds the pressure chamber.

4. A supporting device as claimed in claim 1, wherein the further static gas bearing is provided with a gas supply line which is in communication with the pressure chamber.

5. A supporting device as claimed in claim 1, wherein the intermediate part comprises a passage by means of which the pressure chamber is in communication with a main chamber of the gas spring provided in the first part.

6. A supporting device as claimed in claim 5, wherein the passage is provided in the bottom wall of the intermediate part and merges into a further passage which is provided in the support surface of the first part and is in communication with the main chamber.

7. A supporting device as claimed in claim 3, wherein the gas supply line of the further static gas bearing comprises the passage in the bottom wall of the intermediate part.

8. A supporting device as claimed in claim 1, wherein the piston is fastened to the second part by means of a connection member which is substantially undeformable parallel to the support direction and which is capable of bending about two mutually perpendicular bending axes which are perpendicular to the support direction.

9. A supporting device as claimed in claim 8, wherein the connection member comprises a rubber ring.

10. A lithography projection apparatus for use with a mask and a substrate, said apparatus, comprising:

a base constructed and arranged to support said lithography projection apparatus;

a frame;

a radiation source operable to emit radiation;

a focusing unit positioned in radiation receiving relation with respect to said radiation source, said focusing unit being operable to receive and focus the radiation emitted by said radiation source and emit the focused radiation along a main axis, said focusing unit being carried by said frame;

a mask holder constructed and arranged to support the mask in an operative position wherein the radiation emitted from said radiation source passes through said mask prior to being received and focused by said focusing unit;

a substrate holder constructed and arranged to support the substrate in an operative position along said main axis wherein the focused radiation emitted from said radiation source is radiated onto the substrate; and a plurality of supporting devices supporting said frame on said base, each of said supporting devices comprising:
a frame connecting part connected to said frame;
a base connecting part connected to said base;
an intermediate part having a wall defining a piston receiving chamber, said intermediate part being provided on one of said base connecting part and said frame connecting part;
a piston provided on the other of said base connecting part and said frame connecting part, said piston being received within the piston receiving chamber defined by said wall for movement relative to said wall in a supporting direction, said piston and said wall providing a pair of opposing surfaces that face one another in a spaced apart relation in a plane that is perpendicular to said supporting direction;
a gas spring having a gas-filled pressure chamber bound at least in part by said wall defining said piston receiving chamber and said piston, said gas spring being operable to support said frame on said base for gas cushioned movement relative to said base in said supporting direction, thereby reducing transmissions of vibrations in said supporting direction from said base to said frame through said supporting devices; and
a static gas bearing positioned between said opposing surfaces of said piston and said wall defining said piston receiving chamber, said static gas bearing being operable to (a) seal said gas spring between said opposing surfaces and (b) maintain the aforesaid spaced relation between said opposing surfaces in said plane, thereby reducing transmissions of vibrations in said supporting direction from said base to said frame through said supporting devices.

11. A lithography projection apparatus according to claim 10, wherein said gas bearing is communicated to said gas-filled pressure chamber.

12. A lithography projection apparatus according to claim 10, wherein said intermediate part and the aforesaid one of said base connecting part and said frame connecting part provide a pair of opposed surfaces that face one another in spaced apart relation in said supporting direction, said lithography projection apparatus further comprising:
a further static gas bearing positioned between said opposed surfaces of said intermediate and the aforesaid one of said base connecting part and said frame connecting part, said further static gas bearing being operable to maintain the aforesaid spaced apart relation between said opposed surfaces in said supporting direction, thereby reducing transmissions of vibrations in directions parallel to said plane from said base to said frame through said supporting devices.

13. A lithography projection apparatus according to claim 12, wherein said further gas bearing is communicated to said gas-filled pressure chamber.

14. A lithography projection apparatus according to claim 10, wherein said gas-filled pressure chamber is communicated to a gas-filled main chamber.

15. A lithography projection apparatus according to claim 10, wherein said supporting direction is parallel to said main axis.

16. A lithography projection apparatus according to claim 10, wherein said piston is supported on said frame connecting part and wherein said intermediate part is supported on said base connecting part.

17. A lithography projection apparatus according to claim 12, wherein said piston is supported on said frame connecting part, wherein said intermediate part is supported on said base connecting part, and wherein said intermediate part and said base connecting part provide said pair of opposed surfaces that face one another in the aforesaid spaced apart relation in said supporting direction;
said further static gas bearing being positioned between said opposed surfaces of said intermediate part and said base connecting part, said further static gas bearing being operable to maintain the aforesaid spaced apart relation between said opposed surfaces in said supporting direction, thereby reducing transmissions of vibrations in directions parallel to said plane from said base connecting part to said intermediate part.

18. A lithography projection apparatus according to claim 10, wherein said wall defining said piston receiving chamber is cylindrical and wherein said piston is cylindrical.

19. A supporting device for supporting a first structure on a second structure, said supporting device comprising:
a first connecting part constructed and arranged to be connected to said first structure;
a second connecting part constructed and arranged to be connected to said second structure;
an intermediate part having a wall defining a piston receiving chamber, said intermediate part being provided on one of said first connecting part and said second connecting part, said intermediate part and the aforesaid one of said first connecting part and said second connecting part providing a pair of opposed surfaces that face one another in spaced apart relation in a supporting direction;
a piston provided on the other of said first connecting part and said second connecting part, said piston being received within the piston receiving chamber defined by said wall for movement relative to said wall in said supporting direction, said piston and said wall providing a pair of opposing surfaces that face one another in a spaced apart relation in a plane that is perpendicular to said supporting direction;
a gas spring having a gas-filled pressure chamber bound at least in part by said wall defining said piston receiving chamber and said piston, said gas spring being operable to support said first structure on said second structure for gas cushioned movement relative to said second structure in said supporting direction, thereby reducing transmissions of vibrations in said supporting direction from said first structure to said second structure through said supporting device;
a static gas bearing positioned between said opposing surfaces of said piston and said wall defining said piston receiving chamber, said static gas bearing being operable to (a) seal said gas spring between said opposing surfaces and (b) maintain the aforesaid spaced relation between said opposing surfaces in said plane, thereby reducing transmissions of vibrations in said supporting direction from said first structure to said second structure through said supporting device; and a further static gas bearing positioned between said opposed surfaces of said intermediate part and the aforesaid one of said first connecting part and said second connecting part, said further static gas bearing being operable to maintain the aforesaid spaced apart relation between said opposed surfaces in said supporting direction, thereby reducing transmissions of vibrations in said plane from the aforesaid of said first connecting part and said second connecting part to said intermediate part.

20. A supporting device according to claim 19, wherein said static gas bearing is communicated to said gas-filled pressure chamber.

21. A supporting device according to claim 19, wherein said second gas bearing is communicated to said gas-filled pressure chamber.

* * * * *